United States Patent [19]

Witkin et al.

[11] 4,066,868
[45] Jan. 3, 1978

[54] TEMPERATURE CONTROL METHOD AND APPARATUS

[75] Inventors: Donald E. Witkin; Arnold G. Bowles, both of Warren, Pa.

[73] Assignee: National Forge Company, Irvine, Pa.

[21] Appl. No.: 593,709

[22] Filed: July 7, 1975

Related U.S. Application Data

[62] Division of Ser. No. 536,372, Dec. 26, 1974, Pat. No. 3,922,527.

[51] Int. Cl.² .............................................. H05B 1/02
[52] U.S. Cl. ..................................... 219/486; 219/484
[58] Field of Search ................... 23/301 R, 93; 13/24, 13/25, 31; 219/477, 480, 483, 484, 485, 494, 486; 165/32, 58, 185

[56] References Cited
U.S. PATENT DOCUMENTS

| | | | |
|---|---|---|---|
| 3,134,006 | 5/1964 | Dorsman | 219/494 X |
| 3,551,646 | 12/1970 | Harmon | 219/485 |
| 3,736,360 | 5/1973 | Bergman et al. | 13/31 |
| 3,741,718 | 6/1973 | Boyer et al. | 13/25 X |

Primary Examiner—J. V. Truhe
Assistant Examiner—Fred E. Bell
Attorney, Agent, or Firm—Charles B. Smith; James D. Bock

[57] ABSTRACT

The disclosed invention describes an apparatus and method for bringing a system having high interactive portions to a predetermined temperature distribution. The invention includes a difference controller which provides, through two separate drivers, a fixed total amount of energy to the system being controlled. If the system being controlled also has a long cycle time, second and third temperature controllers may be used to bring the system to the equilibrium temperature with a minimum amount of overshoot. The invention is particularly advantageous when used in connection with a high pressure, high temperature vessel useful in growing quartz crystals.

7 Claims, 5 Drawing Figures

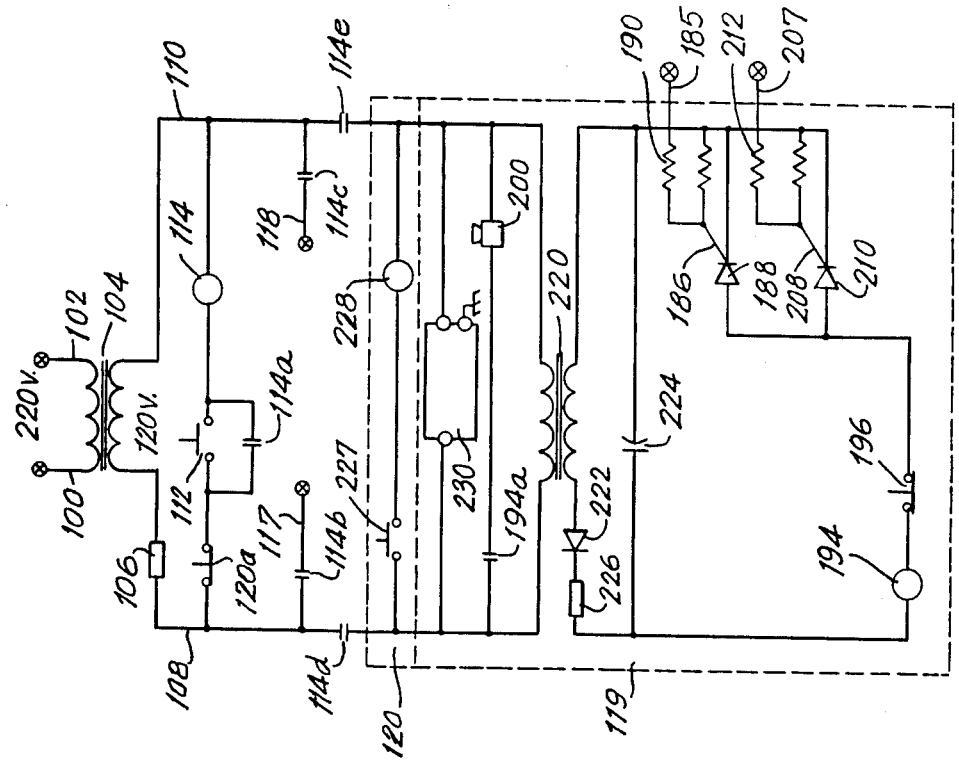
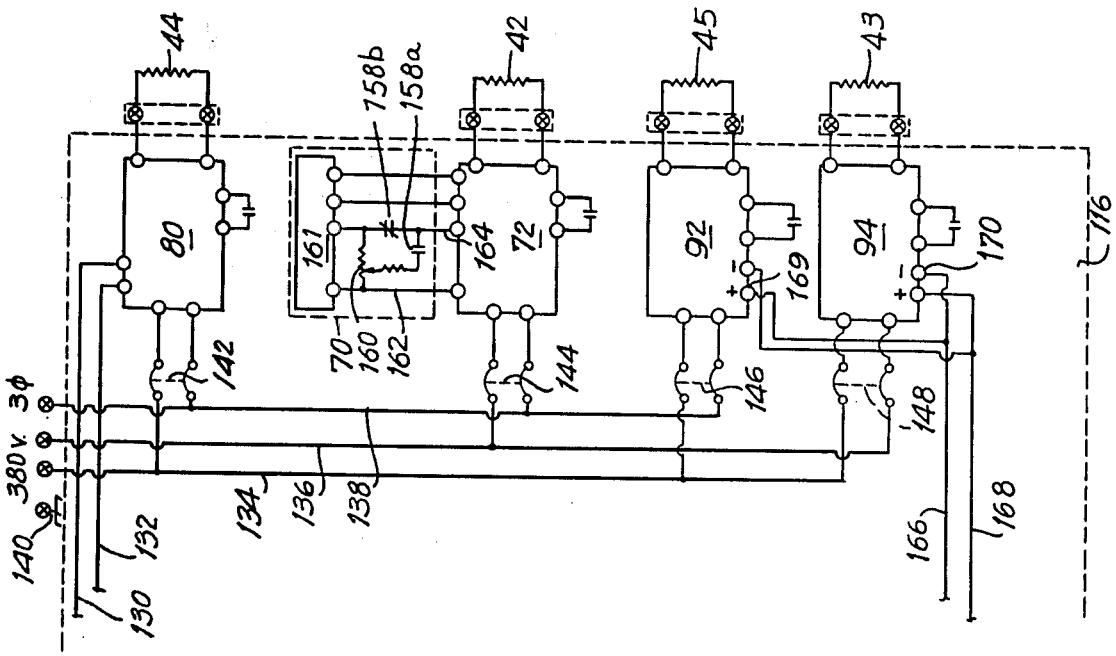

TEMPERATURE CONTROL METHOD AND APPARATUS

This is a division of application Ser. No. 536,372, filed Dec. 26. 1974 now U.S. Patent No. 3,922,527.

BACKGROUND OF THE INVENTION

This invention relates to a temperature control apparatus and method and more particularly to a temperature control apparatus and method for use in connection with multi-section, interactive system which have a large thermal mass and in which the temperature sensing devices are located sufficiently far from the source of heat that a significant time lag occurs between the time heat is applied and the time when it is first recorded or sensed by the sensing device.

Temperature control apparatus and methods are well known. They generally require one or more temperature sensors whose output is delivered to an electrical control circuit which compares the output of the sensor to a predetermined standard. As a result of the comparison, more or less power is applied to a temperature element associated with the temperature sensor. Several different types of temperature control circuits and sensors are commercially available for use in a variety of applications.

In those situations where temperature control apparatus is used to control the temperatures at at least two different locations in the same system, several problems may arise. First, the electrical controllers, where there is at least one controller associated with each location, may interact. Thus an increase in the heating power at one location in the system may affect the performance of a controller associated with another location in the system. While this introduces additional complexity into the temperature control apparatus, in most circumstances, there is commercially available apparatus to maintain the proper temperature control and the multiple controller system will maintain the proper temperature distribution and control.

In certain instances, however, commercially available systems are unsatisfactory. One example is temperature control in a high pressure vessel used to grow high quality quartz crystals. In the particular quartz growing process of interest, a pressure vessel is divided into upper and lower sections. A saturated quartz solution is maintained in the lower section and a seed crystal onto which quartz will deposit is placed in a quartz solution in the upper section of the vessel. The saturated quartz solution moves, by convection, into the upper section, where the solution becomes supersaturated which causes quartz to deposit onto the seed crystal. The two most critical temperature parameters affecting the growth of high quality crystals are the temperature in the top section of the vessel (the growth zone) and the difference in temperature between the top and bottom sections of the vessel. Since, the growing process provides a significant internal transfer of heat from the bottom section to the top section as the saturated fluid moves upward, there results what for commercially available control systems is an intolerable amount of interaction between the controller affecting the temperature in the top section and the controller affecting the temperature in the bottom section.

An additional problem in the quartz growing process is the extremely slow response of the thermodynamic system. This is especially true when the temperature sensors are placed in the fluid along the central line of the vessel, the preferred location to measure temperature since these are the actual temperatures which affect the process. The cycle time of such a system, depending upon the vessel construction, may be up to twenty-four or forty-eight hours. Under these circumstances, the time required to reach stable equilibrium, using commercial systems without manual intervention, is unacceptable since the resulting crystal is not of sufficiently high quality.

The resulting crystal is unacceptable because crystal from solution deposits continually while the temperature controller attempts to effect equilibrium. Thus as the temperature varies, so does the quality and structure of the crystal. To solve the problem of long cycle times, typically, the gain of the temperature controller is reduced to a value corresponding to the long cycle time or thermal time lag. This is a function of both sensor position and thermal mass. In addition to reducing the controller gain, these controllers often have reset capability which, applicants have found, further increases the control problem. Necessarily, manual intervention is then required to readjust the controller in order to reduce the time required to obtain equilibrium.

It is therefore an object of the invention to provide, in a temperature control system in which the temperature controllers interact and in which the thermodynamic response is slow, a temperature control method and apparatus which automatically achieves equilibrium conditions in a minimum time. Other objects of the invention are to provide an improved and superior temperature control method and apparatus which is simple in construction, efficient in operation, reliable, free from manual intervention, and which minimizes interaction between the controllers.

SUMMARY OF THE INVENTION

In one aspect, the invention features a temperature control system having first and second temperature sensing means which provide outputs indicative of the temperature at first and second locations respectively in a system being controlled. A first temperature controller having an output signal responsive to both the first and second temperature sensing means is provided to control the output of a drive means. The drive means, which may include a first and a second driver, is responsive to the first controller and applies energy to a first heater element associated with the first location and a second heater element associated with the second location. The total energy applied to the heater elements is substantially independent of the output signal from the temperature controller.

In a preferred embodiment, the temperature sensing means are thermocouples and the temperature controller is responsive to the difference between the temperatures sensed at the first and second locations. In addition, the output of each driver is proportional to the output signal from the controller. It is also preferable to maintain the total energy applied to the heaters constant.

In another aspect, the invention features two temperature controllers, each responsive to the temperature in a system having a long time lag or cycle time. The first controller is adjusted so that its set point is offset from the high edge of its proportional band, that is, where the energy applied by a driver to its associated heating element is significantly below its maximum value. The second controller operates with its associated driver to provide a large amount of energy until the temperature exceeds a predetermined level at which point the energy output is reduced. Preferably the first controller operates at a high gain and with no reset. In this manner, equilibrium is relatively quickly reached with minimum overshoot.

The four controllers described above are, in the preferred embodiment of the invention, advantageously combined. Such a system is described hereinafter.

Where the temperature controller apparatus is used in connection with a pressure vessel having a high strength walled chamber which is divided by a baffle into upper and lower portions or sections, the invention further features upper and lower insulating walls spaced outwardly from the enclosed upper and lower sections of the chamber. Upper insulating wall is constructed to effect greater heat losses than would normally be expected by providing air holes through which heat can escape and by making the thickness of the insulating walls less than that of the lower insulating walls.

The method for controlling the temperature at two locations in an interactive system features the steps of sensing the temperature at a first location, sensing the temperature at a second location, applying output power in response to the differences between the sensed temperatures to heater elements and maintaining the total energy applied to the heater elements substantially constant.

In another aspect, the method features sensing the temperature in a system in which there is substantial time lag and applying energy in response to the sensed temperature to two heaters. The energy supplied to one heater is reduced at a predetermined sensed temperature and the energy applied to the other heater is controlled so that the energy supplied is minimal at the equilibrium temperature.

Advantageously both aspects of the method can be combined.

BRIEF DESCRIPTION OF THE DRAWINGS

Other features, objects, and advantages of the invention will appear from the following description of a preferred embodiment of the invention taken together with the attached drawings thereof in which:

FIGS. 3A, 3B and 3C show an electrical circuit diagram of a control apparatus according to a preferred embodiment of the invention.

DESCRIPTION OF A PREFERRED EMBODIMENT

Figure 1:
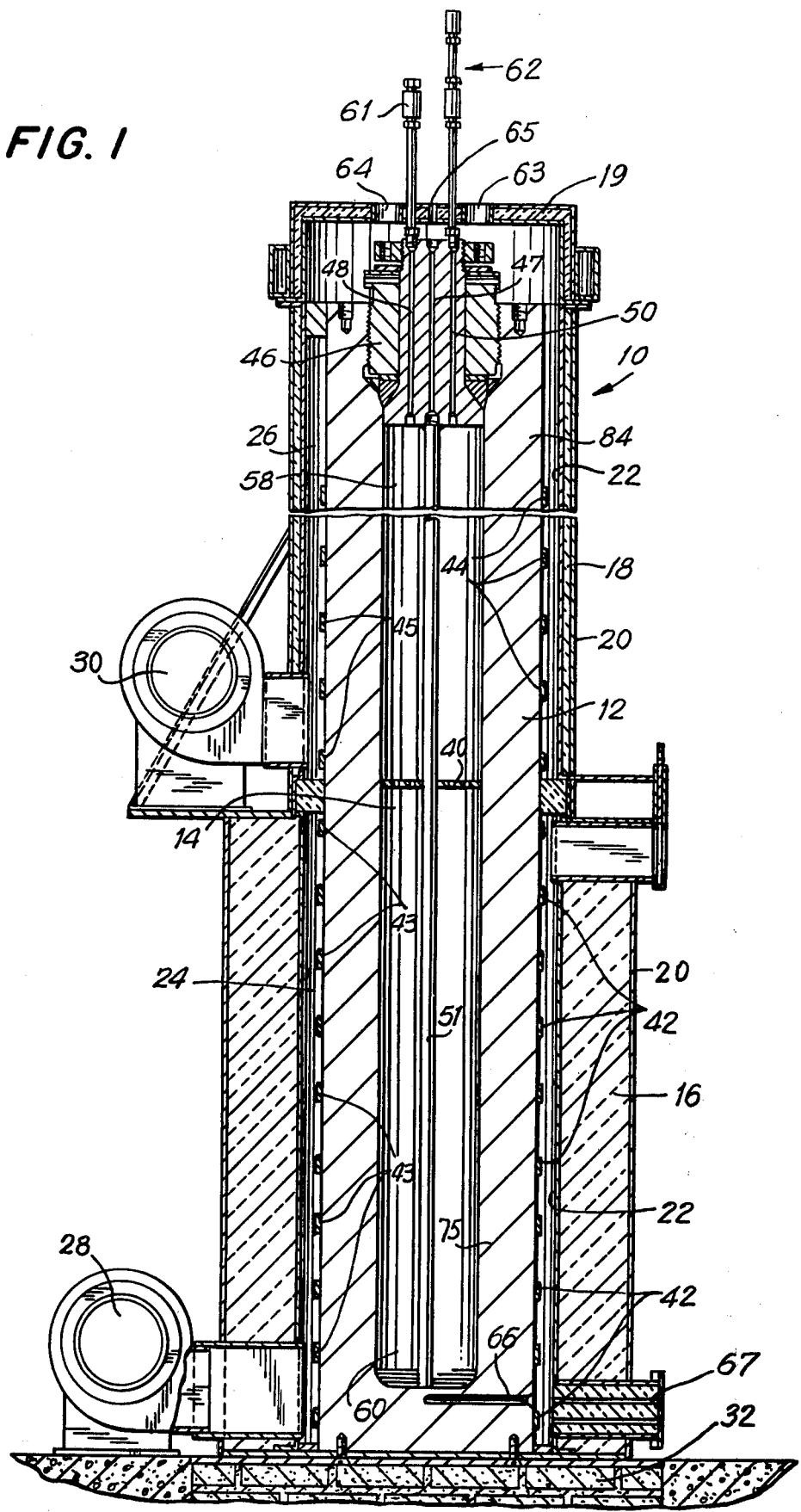
FIG. 1 is a cross-section view of a pressure vessel used in connection with the preferred embodiment of the invention.

Referring to the drawings, the temperature control method and apparatus of the present invention is especially useful for controlling the temperature distribution within a high pressure vessel 10 in which quartz crystals are grown. The high pressure vessel 10 of FIG. 1 has a cylindrical, thick wall 12, preferably steel, enclosing a cylindrical chamber 14. The cylindrical wall 12 is surrounded on three sides by a lower insulating wall 16 and an upper insulating wall 18 which includes a top insulating portion 19. In this embodiment, the insulating walls are spaced from and generally conform to the exterior shape of wall 12 and are provided with a thin aluminum outside support 20 and a thicker steel inside support 22. The lower insulating wall 16 is thicker than upper insulating wall 18 for reasons which will be discussed below. A lower air space 24 and an upper air space 26 are provided between thick wall 12 and insulating walls 16, 18 respectively. Fans 28 and 30, preferably centrifugal fans, communicate with lower and upper air spaces 24, 26 respectively to provide cooling for the exterior of thick wall 12. Vessel 10 rests upon a brick foundation 32.

Chamber 14 of pressure vessel 10 is provided with a baffle plate 40 approximately half way between the upper and lower portions of chamber 14. Lower heater elements 42, 43 and upper heater elements 44, 45 are chosen to provide, under control of electrical control circuitry, the proper temperature environment for the quartz growing process. In the preferred embodiment, the heater elements are heating bands provided in thermal contact with and around the exterior of thick wall 12.

The space defined by wall 12, that is, chamber 14, is closed at the top by a threaded steel top assembly 46 in which three bores 47, 48 and 50 are made. A hollow tube, 51, extending the length of chamber 14 (and passing through a hole in baffle 40), is welded to the top assembly in alignment with central bore 47. Through the central bore 47 and tube 51, a first and a second temperature sensing means (not shown) are passed and secured to measure the temperature along the center line of an upper portion 58 and a lower portion 60 of chamber 14. Through the second bore 48, access is provided for a pressure transducer (not shown) to measure the pressure within chamber 14 and to record the pressure on a meter 61. A pressure relief valve 62 operates through the third bore 50 to prevent excessive pressure buildup within chamber 14.

The top portion 19 of upper insulating wall 18 includes holes 63, 64 and 65. Holes 63 and 64 provide for a predetermined amount of added heat loss for the proper operation of the system as discussed below. Wires connecting the temperature sensing means to the electrical control circuitry pass through hole 65.

At the bottom of the pressure vessel, a bore 66 in wall 12 and an access hole 67 extending through wall 16 are provided for a third temperature sensor (not shown) to sense the temperature of the vessel wall.

Figure 2:
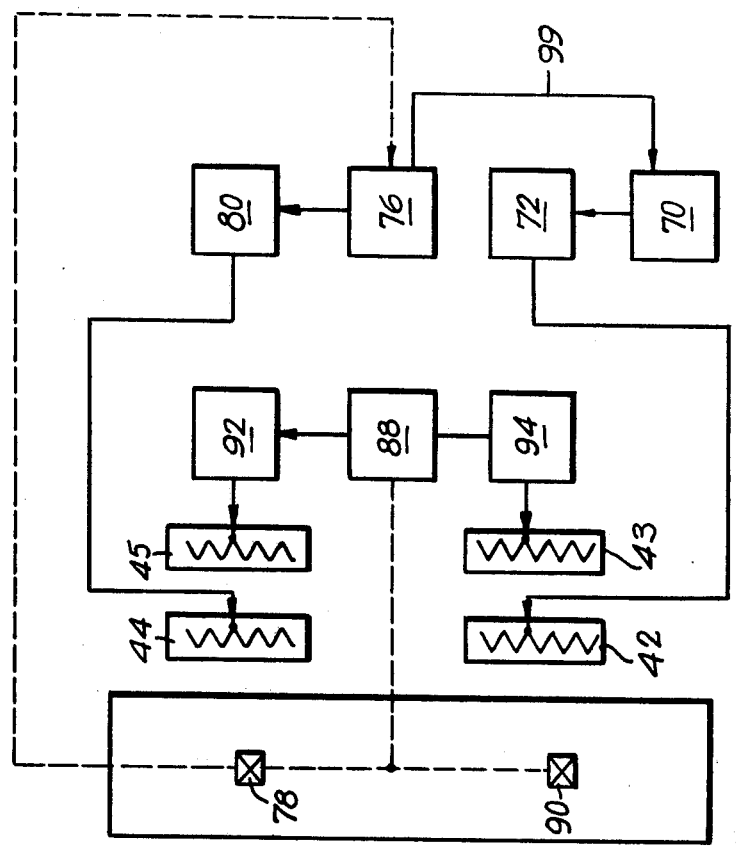
FIG. 2 is a schematic block diagram of the electrical circuit used in connection with the preferred embodiment of the invention.

Referring to FIG. 2, the block diagram shows a temperature control configuration of elements which implement a preferred embodiment of the invention. A temperature controller 70 controls, through a proportional load driver 72, the amount of energy delivered to a bottom heater 42. In the preferred embodiment, bottom heater 42 comprises five of ten cylindrical heating bands which comprise the bottom heater elements 42, 43. These bands are in thermal contact with a bottom section 75 of wall 12. In order to maintain uniform heating in the bottom section, the five heating bands are distributed along the length of the section 75 and comprise, in this embodiment, the heating bands which, counting from the bottom, are the first, thid, fifth, seventh, and ninth heating bands.

A top temperature controller 76 is responsive to the output of a top temperature sensing means 78 to control, through a proportional load driver 80, the energy output to top heater 44. Top heater 44 comprises in the particular embodiment five of ten heating bands which comprise top heater elements 44, 45 in an upper section 84 of wall 12. In order to maintain uniform heating along the length of upper section 84, these five bands are distributed along the length of the upper section and comprise, counting from the top, the first, third, fifth, seventh, and ninth heating bands.

A differential temperature controller 88 is responsive to the difference between the temperatures sensed by the temperature sensing means, shown in this embodiment as top sensor 78 and a bottom temperature sensor 90. Differential controller 88 controls through its associated drive means, proportional load drivers 92 and 94, the energy delivered to a differential top heater 45 and a differential bottom heater 43 respectively. For proper operation according to the invention, the combined energy output of proportional load drivers 92 and 94 is maintained constant or substantially constant regardless of the value of the temperature differential between the top and bottom temperature sensors. Differential heaters 45 and 43 each comprise the remaining five heating bands associated, respectively, with the top and bottom sections of wall 12.

In operation, when the apparatus is first turned on from a cold start, controller 70 operates driver 72 at a high energy output level, controller 76 operates driver 80 at a high energy output level, and controller 88 operates drivers 92 and 94 at energy levels dependent upon the differential input from temperature sensors 78, 90. The sum of the energy output levels of drivers 92 and 94 is, in the preferred embodiment, fixed at a predetermined moderate level.

As the system warms up and approaches its equilibrium temperature distribution, it switches from a warm-up cycle into a growth cycle. This switch takes places at a predetermined temperature of the top portion of chamber 14, the switch-over temperature. When this temperature is reached, as sensed by sensor 78 and acted upon by controller 76, a change of signal level from controller 76 to controller 70 over line 99 causes the energy output to the bottom heater 42 from the load driver 72 to be reduced to a lower value. The energy output to the top heater 44 will also decrease as the temperature of the upper portion of chamber 14 rises and enters the proportional band of the controller 76. The differential output from drivers 94, 92 to heaters 43, 45 may vary depending upon the sensed temperature difference, however, the total amount of energy applied to the differential heaters is preferably constant. By thus maintaining the total amount of energy supplied to the differential heaters constant (although the amount of energy applied to an individual heater may vary), interaction between temperature controllers 76 and 88 is reduced to a minimum.

Interaction between controllers 76 and 88 is even further reduced by intentionally providing additional heat loss from the upper half of the vessel. In the preferred embodiment of the pressure vessel, holes 63 and 64 are provided to introduce a fixed amount of heat loss due to the nature circulation of air entering air space 26 through fan 28 (a centrifugal fan) and exiting through holes 63, 64. The size of holes 63 and 64 determines the amount of added heat loss. In addition, the reduced insulation in upper insulating wall 18 provides an additional loss. In the quartz growing process, the provision for additional heat loss from the upper section of vessel 10 is particularly advantageous because, during the growth process, the upper portion of chamber 14 is maintained at a lower temperature than the lower portion of chamber 14.

The problem of a long cycle time or time lag, which results from the large thermal mass and the placement of the temperature sensors in the pressure vessel of FIG. 1, is met in accordance with the invention as follows. Controller 76 is chosen to have a large gain, no reset, and a set point offset at the high end of the proportional band. Thus, at the equilibrium temperature, the energy supplied by driver 80 is minimal and is significantly below its maximum value. Operating parameters are then chosen so that the maximum energy applied to the vessel by all drive elements during warm-up reduces the warm-up time to a minimum; however, the values of the parameters are constrained because the energy input can cause the temperature of the vessel to rise far above the equilibrium value even if energy input to heater 44 (as controlled by controller 76) drops to zero. To resolve this potential overshoot problem, the energy input to the vessel is reduced at the switch-over temperature to an amount which allows the vessel to "coast" to the desired equilibrium point, taking into account the operation of controller 76 and driver 80. For any particular system, the choice of energy levels and switch-over temperature are most easily determined by trial and error.

Figure 3A:
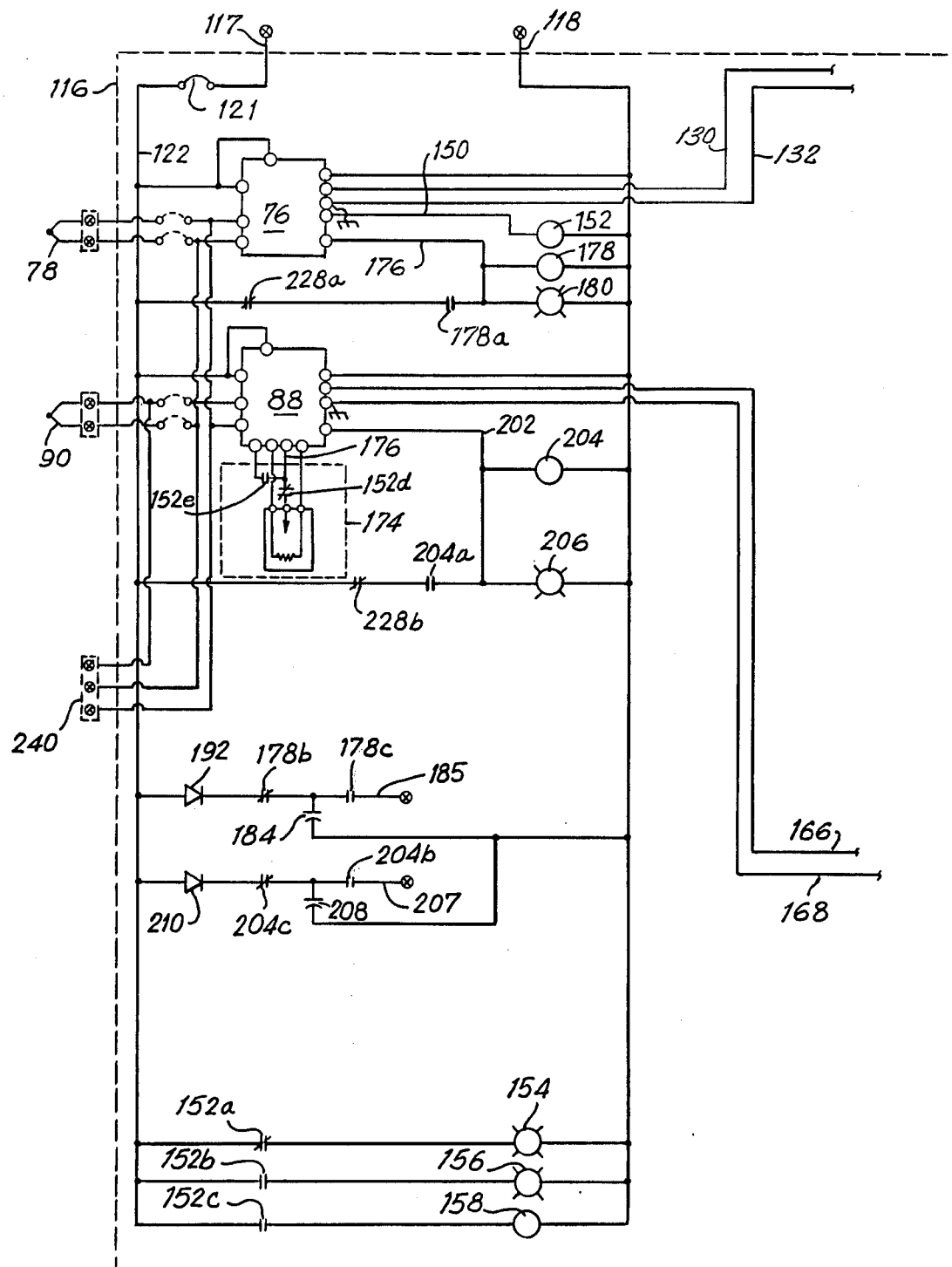

Referring now to the more detailed electrical diagram of the preferred embodiment of the temperature control apparatus and method (FIGS. 3A, 3B, and 3C), input power from a 220 volt source is available between lines 100, 102 (FIG. 3C). The input voltage is stepped down to 120 volts by a transformer 104. The system is protected by a fuse 106 and the 120 volt potential is applied between lines 108, 110.

The temperature control apparatus is turned on by pressing a normally open, momentary pushbutton 112, thereby energizing a system-on relay 114. Relay 114 has five normally open relay contacts, 114a, 114b, 114c, 114d, 114e. Normally open relay contacts 114a will close upon actuation of relay 114 thereby causing relay 114 to remain energized or latched even though pushbutton 112 is thereafter released. By energizing relay 114, 120 volt power is applied to electrical control circuitry 116 (FIGS. 3A and 3B) through relay contacts 114b and 114c over lines 117 and 118 respectively. 120 volt power is also applied to an alarm and system monitoring circuitry 119 and to reset circuitry 120 through relay contacts 114d and 114 e. An emergency stop switch, normally closed momentary switch 120a, is provided to deenergize relay 114.

When power is applied to the electrical control circuitry 116, through circuit breaker 121, over lines 122, 118, the output of each of temperature sensors 78 and 90, in the preferred embodiment, thermocouples, is sensed by controllers 76 and 80 respectively, and energy is applied by load drivers 80 and 92, 94 respectively to heating elements 44 and 45, 43 respectively. Since the temperature will, at turn on, be far below the normal equilibrium point, controller 76 provides as its output signal on lines 130, 132 a command to load driver 80 to supply a maximum output power level to heater 44. Similarly, temperature controller 70 commands driver 72 to supply a maximum output energy level to heater 42. The total or combined energy output of load drivers 92, 94 is, as noted above, fixed.

Load drivers 72, 80, 92, 94 are powered from a 380 volt, three-phase, grounded system over lines 134, 136, 138, 140. The load drivers particularly preferred are SCR Proportional Power Controllers maufactured by Cross Electronics of Warrendale, Pa., under the trademark thyrisTROL. Each of the load drivers is protected by a circuit breaker 142, 144, 146, 148.

As the temperature of the system being controlled increases, a temperature is reached, the switch-over temperature, at which the system leaves the warm-up cycle and begins a growth cycle. In this particular embodiment, the switch-over temperature is a predetermined temperature of the top portion of chamber 14 as measured by temperature sensor 78. At the switch-over temperature, a change of signal level on a line 150 causes a relay 152 to energize. Relay 152 has two normally closed contacts 152a, 152d and three normally open contacts 152b, 152c, 152e. Prior to energization of relay 152, a light 154 indicating that the system was in the warm-up cycle has been illuminated, being powered from lines 122, 118 through relay contacts 152a. When relay 152 is energized, light 154 is extinguished and a light 156, indicating that the system is in the growth cycle, is illuminated, being powered through now closed relay contacts 152b.

During the warm-up cycle, bottom heater element 42 had been receiving full output from load driver 72. The output of driver 72 is determined by the configuration of controller 70. During the warm-up cycle, a relay 158, controlled by normally open relay contacts 152c was not energized. Relay 158 has a normally open relay contact 158a and a normally closed relay contact 158b. Thus, the full voltage across a potentiometer 160 from power supply 161 is placed across lines 162, 164. This configuration causes load driver 72 to supply maximum energy output to bottom heater 42. When relay 152 is energized, indicating the end of the warm-up cycle and the beginning of the growth cycle, relay 158 is similarly energized causing normally open contacts 158a to close and normally closed contacts 158b to open. In this growth cycle configuration, only a fraction of the potential across potentiometer 160 is placed across lines 162, 164. Load driver 72 is responsive to this growth cycle configuration to supply a smaller energy output level to bottom heater 42. In the preferred embodiment, the energy output level to bottom heater 42 during warm-up is 12 kilowatts, while the energy output level to bottom heater 42 during the growth cycle is seven and one-half kilowatts.

Differential temperature controller 88 is responsive to the signals from both temperature sensors 78, 90, thermocouples in the preferred embodiment. In the series connection shown in FIG. 3, the input to temperature controller 88 reflects the difference between the temperatures sensed by temperature sensors 78, 90 in the upper and lower portions of chamber 14. The electrical output of differential temperature controller 88 over lines 166, 168, representing the temperature difference between sensors 78, 90, is applied to differential load drivers 92, 94. The connections to drivers 92, 94 are made so that the signal applied to driver 92 represents the output of controller 88 in a first sense, a positive sense, and the signal applied to driver 94 represents the output of controller 88 in a second sense, a negative sense, that is, line 166 is connected to positive input terminal 169 of driver 92, and line 166 is connected to negative input terminal 170 of driver 94. Drivers 92 and 94 are arranged internally so that the sum of their outputs, as a result of the above configuration of input signals, is fixed, and for this particular system, fixed to be five kilowatts. Thus, for example, if the signal level of lines 166, 168 is low, driver 92 may deliver the substantial portion of the five kilowatts to heater 45 while driver 94 delivers practically no energy to heater 43. If, on the other hand, the signal level on lines 166, 168 is relatively high, driver 94 may deliver the substantial portion of the five kilowatts to heater 43 while driver 92 delivers practically no energy to heater 45. In between the extreme signal levels, there is a constant trade-off between the energy levels delivered to heaters 45, 43 by drivers 92, 94 respectively. The sum of the energy to heaters 45, 43 is, in the preferred embodiment, a fixed constant.

Temperature controllers 76 and 88 may be, for example, of the type manufactured by Leeds & Northrup under the same ELECTROMAX III. These units are available with various options, for example: a proportional band which can be varied in response to an outside signal level, an internally variable set point, reset, rate, an output signal level change if the sensor output exceeds a preset maximum value, and an output signal level change if the sensor output is outside of the proportional band limits.

In the preferred embodiment, controller 88 is chosen to be of the type which has an automatically adjustable set point; that is, the set point of controller 88 is automatically varied depending upon whether the system is in a warm-up or growth cycle. When the system is in the warm-up cycle, the set point for controller 88 is less than when the system is in the growth cycle. The change in the set point of controller 88 is effected by a circuitry 174. The value of the set point of controller 88 is changed when relay 152 is energized at the switch-over temperature. Relay contacts 152d and 152e change their state thereby changing the connection to line 176 to change the set point.

In the preferred embodiment, the following sets of parameters are typical of those used to control the temperature environment of the pressure vessel described above:

| For controller 76 and driver 80: | |
|---|---|
| Set Point | 360° C. |
| Proportional Band | 14° C. |
| Reset | None |
| Rate | None |
| Maximum Power Output | 13 KW |
| Set Point Offset | 1.25 KW at Set Point |
| Minimum Power Output | 0 KW |
| Switch-Over Temperature | 340° – 355° C. |
| For differential controller 88 and drivers 92, 94: | |
| Set Point | 15° C. (warm-up) |
| Set Point | 30° C. (growth) |
| Proportional Band | 30° C. |
| Reset | .1 repeats/min. |
| Rate | None |
| Maximum Power Output | 5 KW/driver |
| Total Maximum Power Output | Fixed at 5KW |
| Total Minimum Power Output | Fixed at 5KW |
| For controller 70 and driver 72: | |
| Output power during warm-up cycle | 12 KW |
| Output power during growth cycle | 7,5 KW |

For other systems, different values for the parameters may, and in general will, be required.

The temperature control apparatus also has an alarm and monitor capability to insure that the system is operating properly and normally. For example, if the temperature sensed by sensor 78 is outside the proportional band of controller 76, a change in signal level is applied to a line 176 which causes a relay 178 to energize and a light 180 to be illuminated. Relay 178 has a normally closed relay contact 178b and two normally open relay contacts 178a, 178c. Relay contacts 178a of relay 178 cause relay 178 to latch in the energized position. Thus even if the energizing signal level on line 176 is removed, relay 178 remains energized and light 180 remains illuminated. Energization of relay 178 also initiates an alarm signal by causing the charge which has collected on a capacitor 184 to be "dumped" over line 185 into a control gate 186 of a silicon controlled rectifier 188 through a resistor 190. The charge on capacitor 184 had previously built up during the non-alarm period through a diode 192 and the normally closed contacts 178b of relay 178.

When the charge on the capacitor is "dumped" into gate 186 of silicon controlled rectifier 188 through relay contacts 178c, the rectifier 188 turns on thereby energizing a relay 194 through normally closed pushbutton 196. Energization of relay 194 closes its normally open relay contacts 194a thereby turning on an alarm horn 200. The horn may be silenced by momentarily opening pushbutton 196 thereby turning the silicon controlled rectifier off and deenergizing relay 194. The silicon controlled rectifier will not turn on again since the charge on capacitor 184 has been dissipated.

In like manner, if the difference temperature sensed between sensors 78, 90 is outside the proportional band of differential temperature controller 88, a signal level is provided on a line 202 to cause energization of a relay 204 and illumination of a light 206. Relay 204 has two normally open contacts 204a, 204b and a normally closed contact 204c. Relay 204 is connected in a self-latching configuration through its contacts 204a which cause relay 204 to remain energized even after the energizing signal level on line 202 disappears. In a manner identical to the sequence of events which take place after energization of relay 178, the charge which has previously built up on a capacitor 208 through a diode 210 and normally closed relay contacts 204c is "dumped" through now closed relay contacts 204b, over line 207, into a gate 208 of silicon controlled rectifier 210 through resistor 212. This causes the rectifier 210 to turn on, energizing relay 194, thereby sounding horn 200 through closed relay contacts 194a.

The silicon controlled rectifiers 188, 210 are connected in a DC circuit. Direct current is provided through a step down transformer 220 whose output is half-wave rectified by a diode 222 and is smoothed by a capacitor 224. The alarm circuit is protected by fuse 226.

Once the alarm has been given and silenced, whichever of relays 178, 204 was energized may be deenergized by momentarily depressing a reset button 227 to momentarily energize a reset relay 228. Relay 228 has two normally closed relay contacts 228a and 228b. When relay 228 is energized, contacts 228a and 228b open thereby deenergizing whichever of relays 178 and 204 was energized (unless the energizing level still exists on one or both of lines 176, 202). Lights 180, 206 would be extinguished also.

In the preferred embodiment a strip chart recorder 230 is provided to monitor the temperatures sensed by sensors 78 and 90. In this way, a permanent record is made of the temperatures in the system during the growing process so that the accuracy of the temperature controller and hence the quality of the grown crystal can be constantly monitored. Recorder 230 is connected to the electrical control circuit at terminal block 240.

It may also be desirable to include in the electrical circuitry additional features by which the pressure vessel is protected from excessive temperatures and pressures. This circuitry could also operate the alarm system if either the temperature or pressure became too great. This addition would be obvious to one skilled in this field and will not be described further here.

Other embodiments will occur to those skilled in the art and are within the following claims:

What we claim is:

1. A method for controlling the temperature difference between two locations is an interactive system comprising the steps of
    sensing a first temperature at the first location,
    sensing a second temperature at the second location,
    applying fist and second output energy in response to the difference between the first and second sensed temperatures to first and second heater elements associated with the first and second locations respectively; and
    maintaining the total energy applied to said first and second heater elements substantially constant.

2. The method of claim 1 including the steps of
    applying a third output energy in response to said first sensed temperature to a third heater element and
    applying a fourth output energy having a finite number of values in response to said first sensed temperature to a fourth heater element.

3. The method of claim 2 wherein said finite number of values is two.

4. The method of claim 2 including the step of reducing the output energy applied to said fourth heater element when said first sensed temperature exceeds a predetermined value.

5. The method of claim 2 including the step of providing greater than normal heat losses in association with said first location.

6. A method for bringing a system from which heat is lost and having a long thermal lag time to an equilibrium temperature comprising the steps of
    sensing the temperature of said system,
    applying a first output energy in response to said sensed temperature to a first heater element, said output energy when the temperature of the system is near the equilibrium temperature being significantly smaller than the available output energy,
    applying a second output energy to a second heater element in response to said sensed temperature, and
    reducing the second output energy when said temperature exceeds a predetermined value.

7. The method of claim 6 including the step of increasing the rate at which heat is lost in the system.

* * * * *